US012598875B2

(12) United States Patent
Mimura et al.

(10) Patent No.: US 12,598,875 B2
(45) Date of Patent: Apr. 7, 2026

(54) DISPLAY DEVICE

(71) Applicant: SHARP KABUSHIKI KAISHA, Sakai City (JP)

(72) Inventors: Hirohide Mimura, Sakai City (JP); Shogo Murashige, Sakai City (JP); Yujiro Takeda, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 738 days.

(21) Appl. No.: 17/802,082

(22) PCT Filed: Mar. 2, 2020

(86) PCT No.: PCT/JP2020/008658
§ 371 (c)(1),
(2) Date: Aug. 24, 2022

(87) PCT Pub. No.: WO2021/176508
PCT Pub. Date: Sep. 10, 2021

(65) Prior Publication Data
US 2023/0090537 A1 Mar. 23, 2023

(51) Int. Cl.
*H10K 59/131* (2023.01)
*H10K 59/80* (2023.01)

(52) U.S. Cl.
CPC ......... *H10K 59/131* (2023.02); *H10K 59/873* (2023.02); *H10K 59/8731* (2023.02)

(58) Field of Classification Search
CPC .............. H10K 59/131; H10K 59/873; H10K 59/8731; H10K 59/1213; H10K 59/124; H10K 50/844; H10K 59/00; H10K 50/8445; H10K 59/126; H10D 86/423; H10D 86/60; H10D 30/6723; G09F 9/30; H05B 33/02; H05B 33/04
See application file for complete search history.

(56) References Cited

U.S. PATENT DOCUMENTS

| | | | | |
|---|---|---|---|---|
| 2010/0295759 A1* | 11/2010 | Tanaka | ............... | H10K 59/8731 345/76 |
| 2011/0001146 A1 | 1/2011 | Yamazaki et al. | | |
| 2014/0138711 A1 | 5/2014 | Yamazaki et al. | | |
| 2016/0126493 A1 | 5/2016 | Yamazaki et al. | | |
| 2017/0373271 A1 | 12/2017 | Yamazaki et al. | | |

(Continued)

FOREIGN PATENT DOCUMENTS

| | | | | |
|---|---|---|---|---|
| CN | 112018153 A | * 12/2020 | ......... | H10K 59/8723 |
| JP | 2011029176 A | 2/2011 | | |

(Continued)

*Primary Examiner* — Chad M Dicke
*Assistant Examiner* — Gary Abel
(74) *Attorney, Agent, or Firm* — ScienBiziP, P.C.

(57) ABSTRACT

A TFT layer is provided that includes a stack of, in sequence, display wires, a protective film, a first flattening film, a metal wire layer and a second flattening film; further, a frame region has a first trench and a second trench respectively provided in the first flattening film and the second flattening film and overlapping the display wires; further, a second electrode is provided to cover the first trench and the second trench; further the protective film includes a first protective film and a third protective film formed of a silicon oxide film, and a second protective film formed of a silicon nitride film.

20 Claims, 10 Drawing Sheets

(56)         References Cited

U.S. PATENT DOCUMENTS

| | | | |
|---|---|---|---|
| 2020/0136087 A1* | 4/2020 | Kim | .................. H10K 59/8731 |
| 2020/0381653 A1* | 12/2020 | Bang | .................... H10K 50/844 |
| 2021/0091339 A1 | 3/2021 | Kishimoto et al. | |
| 2021/0210583 A1 | 7/2021 | Okabe et al. | |
| 2022/0199955 A1* | 6/2022 | Kokame | .................. G09F 9/00 |
| 2024/0040824 A1* | 2/2024 | Kishimoto | ......... H10K 59/1201 |

FOREIGN PATENT DOCUMENTS

| | | | | |
|---|---|---|---|---|
| JP | 2019016474 A | * | 1/2019 | |
| JP | 6648349 B1 | | 2/2020 | |
| WO | WO-2019202739 A1 | * | 10/2019 | ............ H05B 33/22 |
| WO | 2019/224917 A1 | | 11/2019 | |

* cited by examiner

DISPLAY DEVICE

TECHNICAL FIELD

The present disclosure relates to a display device.

BACKGROUND ART

Attention has been recently drawn to self-emission organic EL displays including organic electroluminescence (hereinafter, referred also to as EL) elements, as display devices instead of liquid crystal displays. These organic EL displays include, for instance, a base substrate, a thin-film transistor (hereinafter referred also to as TFT) layer provided on the base substrate, an organic EL element layer provided on the TFT layer, and a sealing film provided to cover the organic EL element layer. Here, the TFT layer includes the following for instance: a base coat film provided on the base substrate; a plurality of TFTs provided on the base coat film; and a protective film composed of an inorganic insulating film, and a flattening film composed of an organic insulating film both provided sequentially to cover the individual TFTs. Further, the organic EL element layer includes, for instance, a plurality of first electrodes provided on the flattening film of the TFT layer, a plurality of organic EL layers provided on the plurality of respective first electrodes, and a second electrode provided to cover the individual organic EL layers.

For instance, Patent Literature 1 discloses an organic EL display having a trench provided in and passing through a first flattening film and a second flattening film, both constituting a TFT layer, and provided in a substantial C-shape in a plan view.

CITATION LIST

Patent Literature

Patent Literature 1: International Publication No. 2019/224917

SUMMARY

Technical Problem

By the way, in the organic EL displays, a structure has been proposed where the trench is provided in the form of a frame so as to surround a display region, where image display is performed, in order to prevent moisture within resin from ingress from a frame region, located around the display region, into the display region. Here, in a structure where a trench is provided in the form of a frame, a display wire extending within the display region and extending to the frame region adjacent to a terminal section is provided to intersect with and overlap the trench. Further, in the organic EL displays, a structure has been proposed where, like that in Patent Literature 1, a metal wire layer is provided between the first flattening film and the second flattening film. Thus, in an organic EL display with both of the above structure, when the metal wire layer is formed by forming the lower part of a trench in the first flattening film, followed by patterning a metal film through wet etching, the protective film exposed from the lower part of the trench is partly removed, thus possibly establishing a short circuit between the display wire, which should be covered with the protective film, and the second electrode of the organic EL element layer, which is formed in a posterior process step.

The present disclosure has been made in view of this point and aims to prevent a short circuit between the display wire and the second electrode in a portion where the display wire and the trench overlap.

Solution to Problem

To achieve the above object, a display device according to the present disclosure includes the following: a base substrate; a thin-film transistor layer provided on the base substrate and including a stack of, in sequence, a plurality of display wires, a protective film, a first flattening film, a metal wire layer and a second flattening film; and a light-emitting element layer provided on the thin-film transistor layer and including a plurality of first electrodes, a plurality of light-emitting layers, and a common second electrode stacked sequentially in correspondence with a plurality of sub-pixels constituting a display region, wherein the plurality of display wires are provided to extend in parallel with each other in the display region, and to extend toward a terminal section disposed in a frame region around the display region, in the frame region, a first trench overlapping each of the plurality of display wires and passing through the first flattening film is provided in the first flattening film, and a second trench overlapping each of the plurality of display wires and passing through the second flattening film is provided in the second flattening film, the common second electrode is provided to cover the first trench and the second trench, the protective film includes a first protective film, a second protective film, and a third protective film sequentially stacked on the plurality of display wires, the first protective film and the third protective film are formed of a silicon oxide film, and the second protective film is formed of a silicon nitride film.

Advantageous Effect of Disclosure

In the present disclosure, the first protective film formed of a silicon oxide film, the second protective film formed of a silicon nitride film, and the third protective film formed of a silicon oxide film are sequentially stacked, thus providing the protective film on the plurality of display wires, and thus, a short circuit between the display wires and the second electrode can be prevented in a portion where the display wires and the trench overlap.

DESCRIPTION OF EMBODIMENTS

The embodiments of the present disclosure will be detailed on the basis of the drawings. It is noted that the present disclosure is not limited to the following embodiments.

First Embodiment

Figure 1:
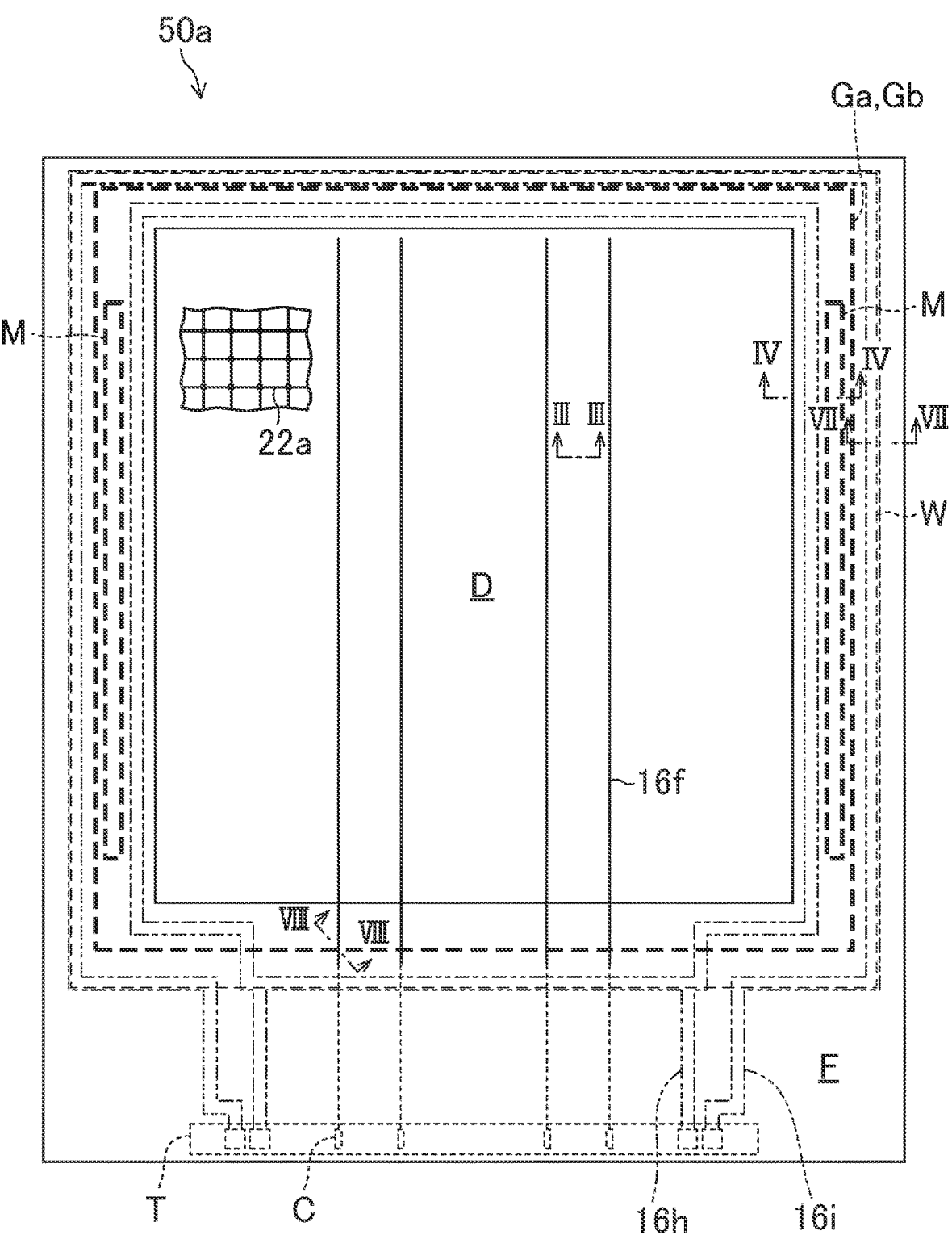
FIG. 1 is a plan view of a schematic configuration of an organic EL display according to a first embodiment of the present disclosure.
Figure 2:
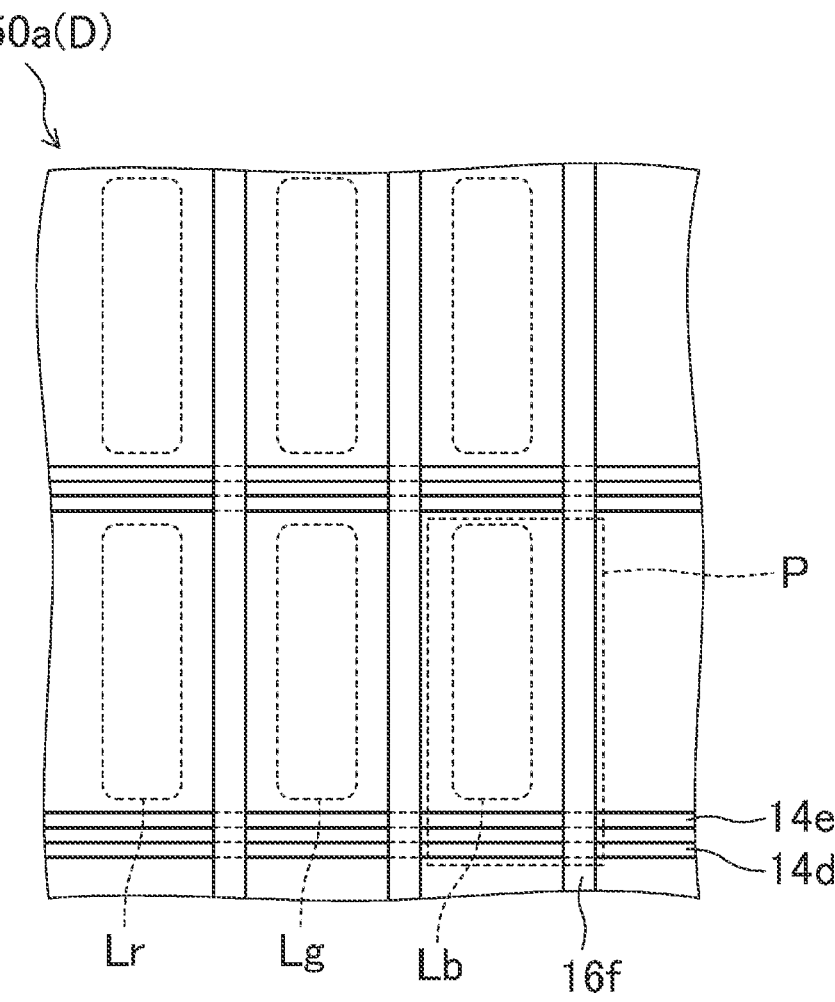
FIG. 2 is a plan view of a display region of the organic EL display according to the first embodiment of the present disclosure.
Figure 3:
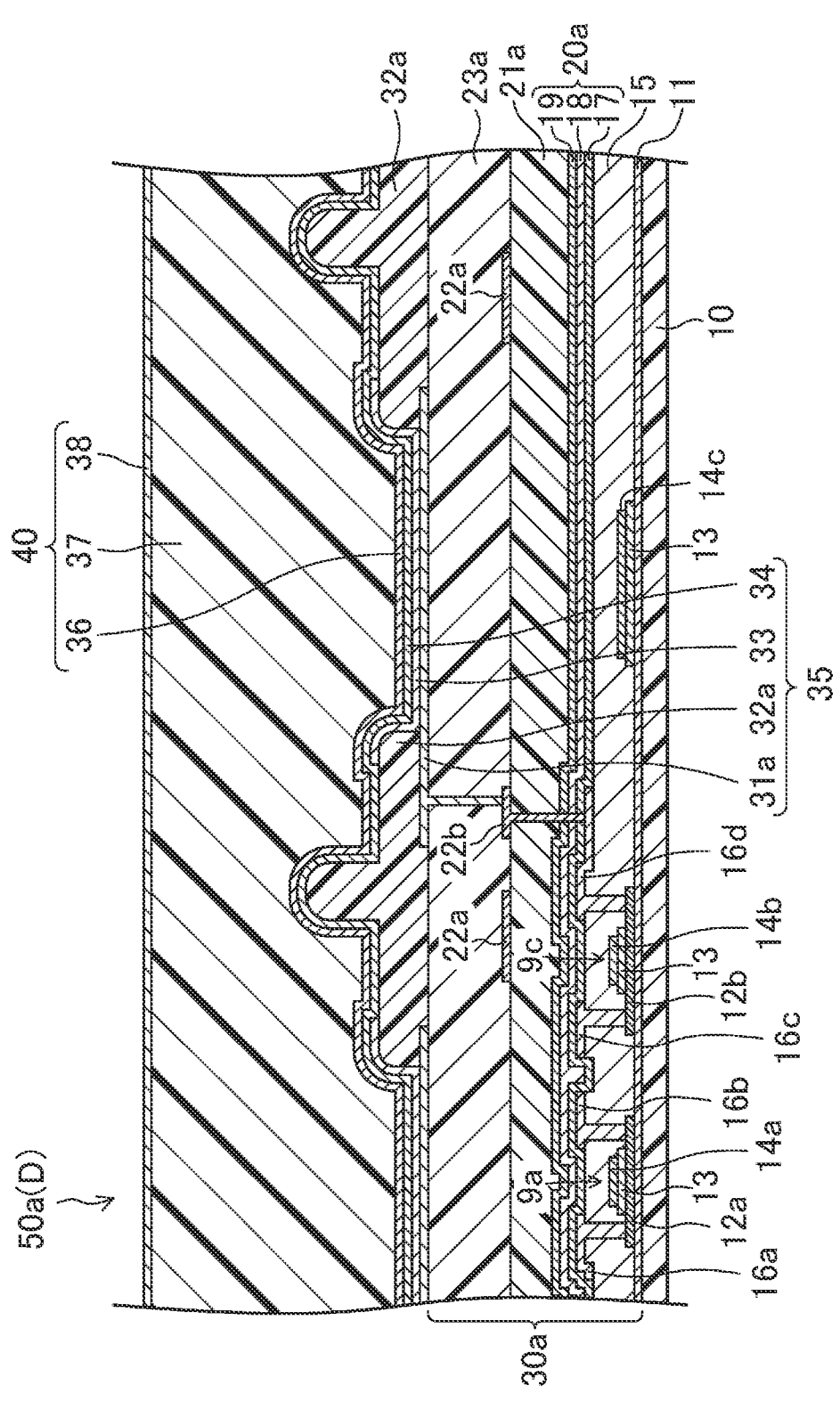
FIG. 3 is a sectional view of the display region of the organic EL display taken along line III-III in FIG. 1.
Figure 4:
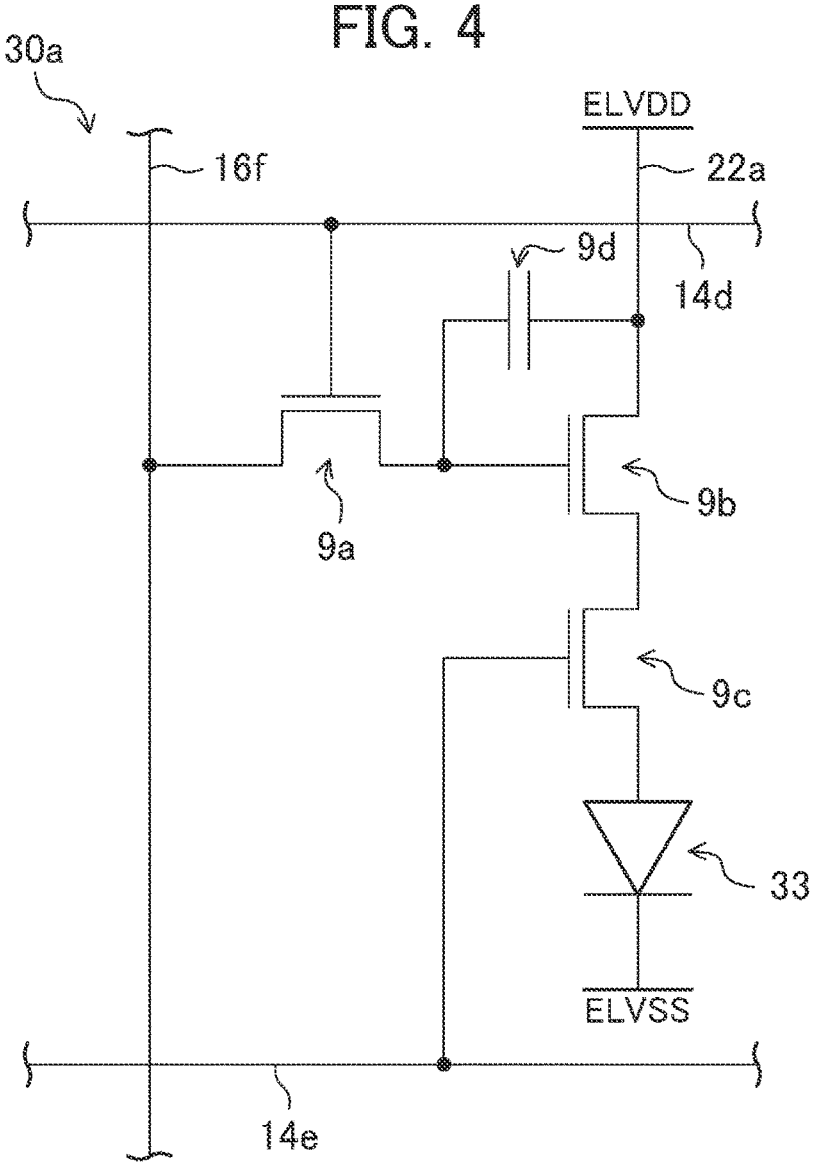
FIG. 4 is an equivalent circuit diagram of a TFT layer constituting the organic EL display according to the first embodiment of the present disclosure.
Figure 5:
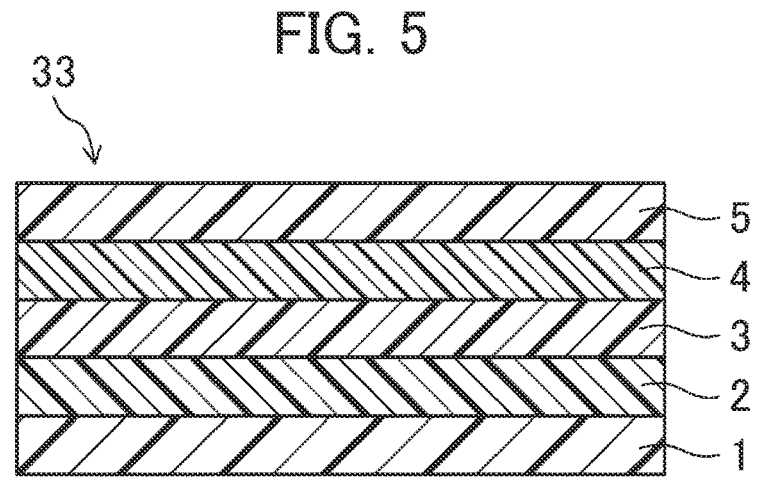
FIG. 5 is a sectional view of an organic EL layer constituting the organic EL display according to the first embodiment of the present disclosure.
Figure 6:
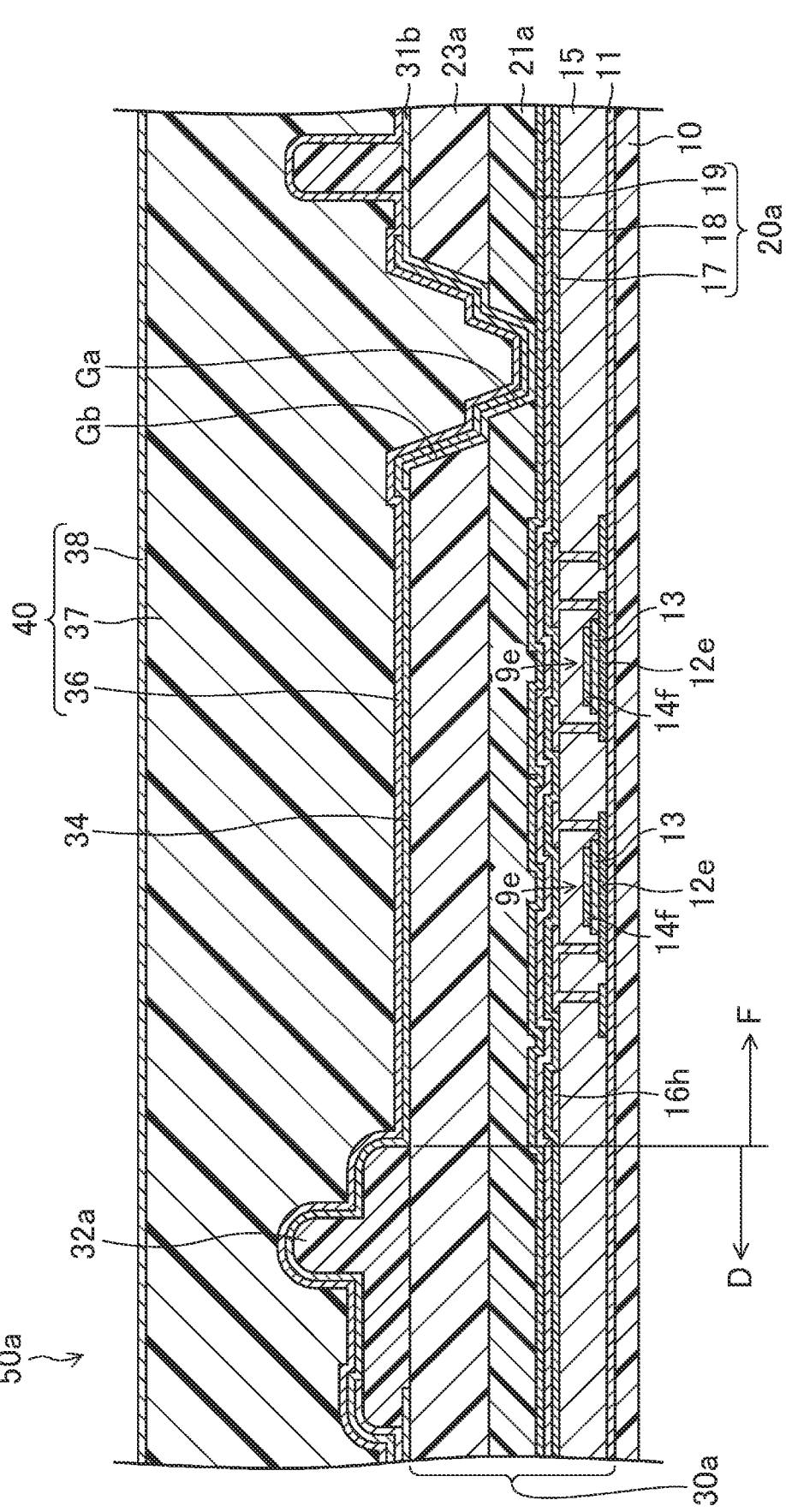
FIG. 6 is a sectional view of the organic EL display taken along line VI-VI in FIG. 1.
Figure 7:
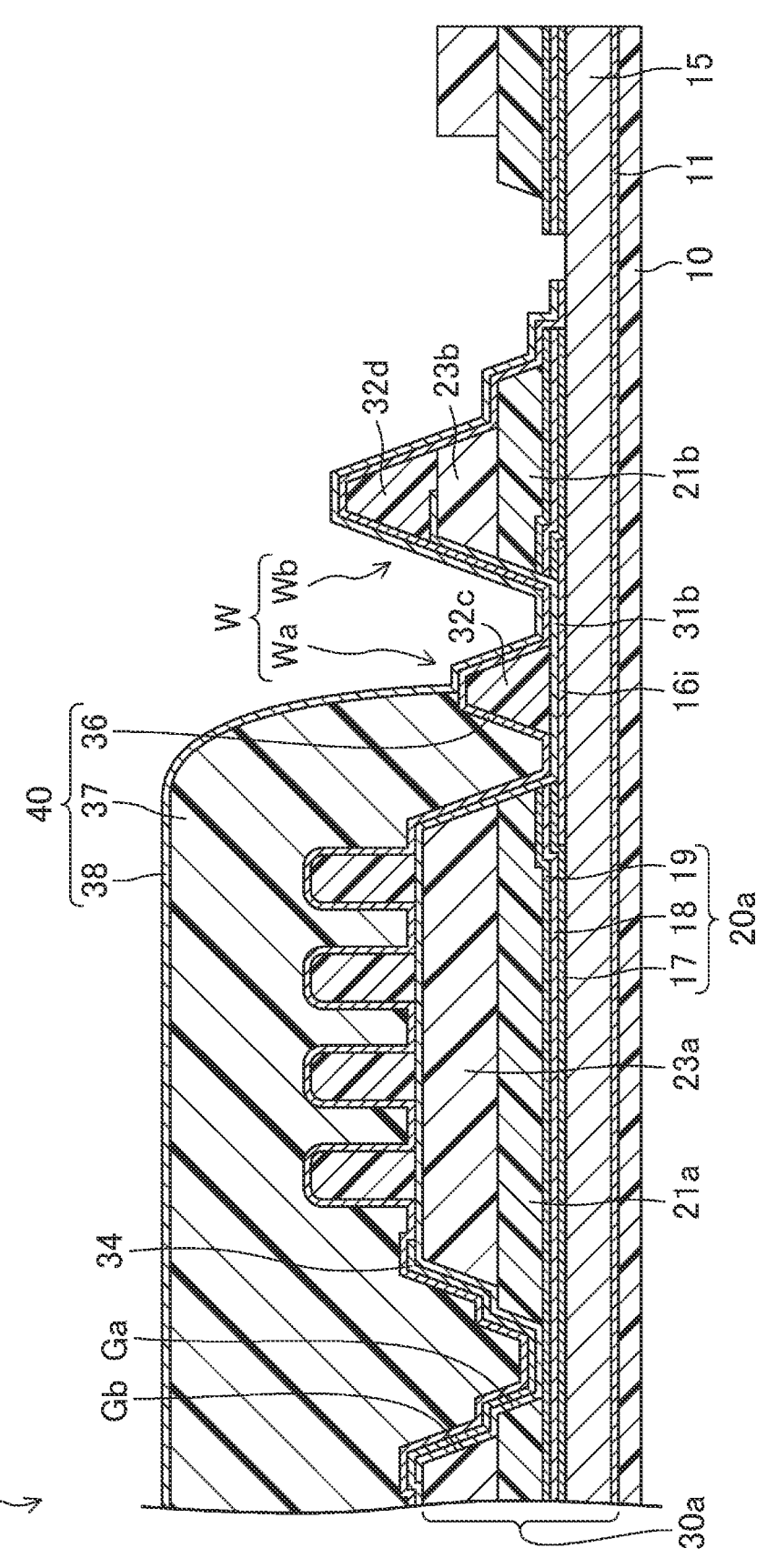
FIG. 7 is a sectional view of a frame region of the organic EL display taken along line VII-VII in FIG. 1.
Figure 8:
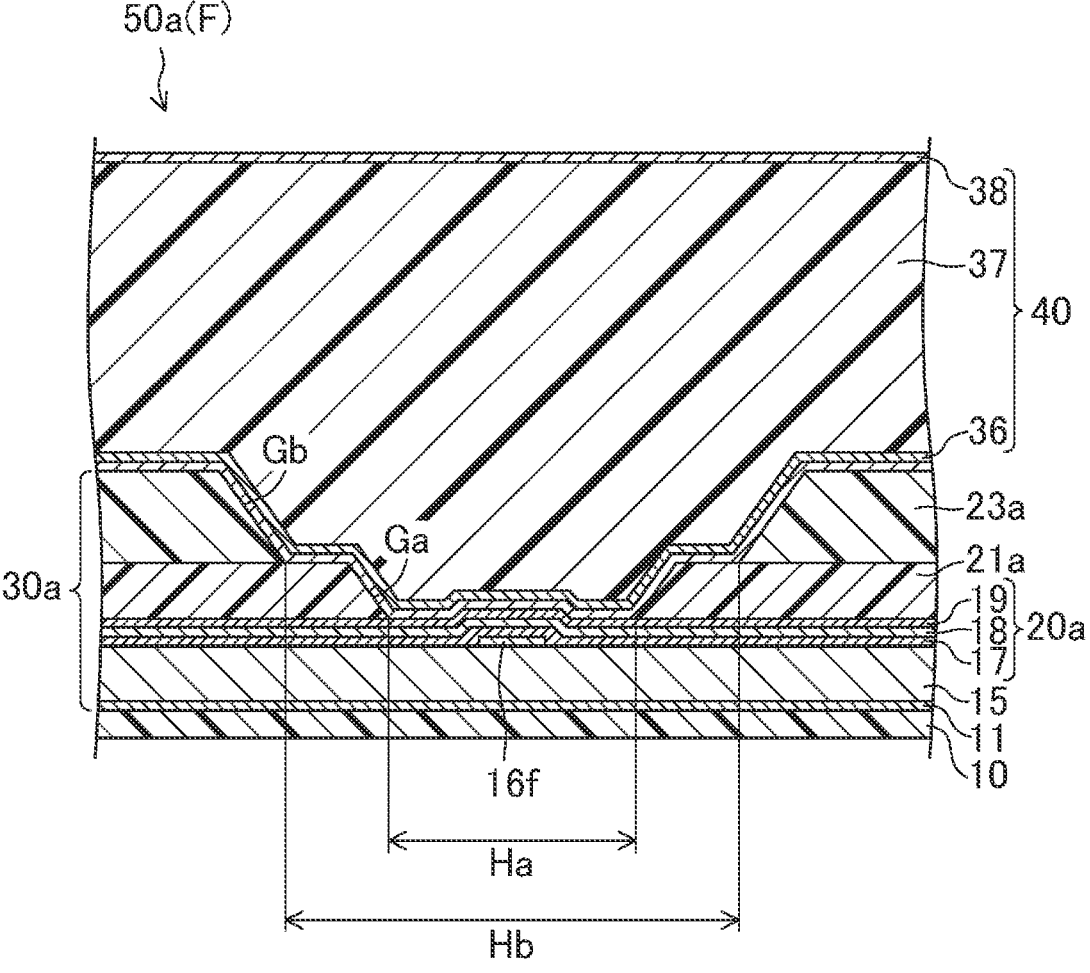
FIG. 8 is a sectional view of the frame region of the organic EL display taken along line VIII-VIII in FIG. 1.

FIG. 1 to FIG. 8 illustrate a first embodiment of a display device according to the present disclosure. It is noted that the following embodiments describe, by way of example, an organic EL display including organic EL elements, as a display device including light-emitting elements. Here, FIG. 1 is a plan view of a schematic configuration of an organic EL display 50*a* according to this embodiment. Further, FIG. 2 is a plan view of a display region D of the organic EL display 50*a*. Further, FIG. 3 is a sectional view of the display region D of the organic EL display 50*a* taken along line in FIG. 1. Further, FIG. 4 is an equivalent circuit diagram of a TFT layer 30*a* constituting the organic EL display 50*a*. Further, FIG. 5 is a sectional view of an organic EL layer 33 constituting the organic EL display 50*a*. Further, FIG. 6 is a sectional view of the organic EL display 50*a* taken along line VI-VI in FIG. 1. Further, FIG. 7 and FIG. 8 are sectional views of a frame region F of the organic EL display 50*a* taken along line VII-VII and line VIII-VIII in FIG. 1.

The organic EL display 50*a* has, for instance, the display region D provided in the form of a rectangular shape and provided for image display, and the frame region F provided in the form of a rectangular frame around the display region D, as illustrated in FIG. 1. It is noted that although this embodiment describes, by way of example, the display region D having a rectangular shape, substantially rectangular shapes, including a shape with an arc-shaped side, a shape with arc-shaped corner, and a shape with part of a side being cut, are also included in this rectangular shape.

The display region D has a plurality of sub-pixels P arranged in matrix, as illustrated in FIG. 2. Further, as illustrated in FIG. 2, a sub-pixel P with a red light-emission region Lr for red display, a sub-pixel P with a green light-emission region Lg for green display, and a sub-pixel P with a blue light-emission region Lb for blue display are provided in the display region D so as to be adjacent to each other. It is noted that in the display region D, three adjacent sub-pixels P having a red light-emission region Lr, a green light-emission region Lg, and a blue light-emission region Lb, for instance, constitute a single pixel.

The frame region F includes a terminal section T provided at the lower end in FIG. 1 so as to extend in one direction (lateral direction in the drawing). Here, the terminal section T includes a plurality of terminals C arranged in a direction where the terminal section T extends, as described later on. The frame region F also has a first trench Ga and a second trench Gb respectively provided in a first flattening film 21*a* and a second flattening film 23*a*, which will be described later on, and both provided, as illustrated in FIG. 1, in the form of a frame in a plan view so as to respectively pass through the first flattening film 21*a* and the second flattening film 23*a* (see FIG. 6 to FIG. 8). The frame region F also includes a drive circuit M provided between the first trench Ga as well as the second trench Gb and the display region D and including an extra-pixel TFT 9*e*, which will be described later on, as illustrated in FIG. 1.

The organic EL display 50*a* includes the following, as illustrated in FIG. 3: a resin substrate layer 10 provided as a base substrate; the TFT layer 30*a* provided on the resin substrate layer 10; an organic EL element layer 35 provided on the TFT layer 30*a* as a light-emitting element layer; and a sealing film 40 provided on the organic EL element layer 35.

The resin substrate layer 10 is made of, but not limited to, polyimide resin for instance.

The TFT layer 30*a* includes the following, as illustrated in FIG. 3: a base coat film 11 provided on the resin substrate layer 10; and a plurality of first TFTs 9*a*, a plurality of second TFTs 9*b* (see FIG. 4), a plurality of third TFTs 9*c* and a plurality of capacitors 9*d* (see FIG. 4) provided on the base coat film 11. It is noted that the TFT layer 30*a* includes, as illustrated in FIG. 6, a plurality of extra-pixel TFTs 9*e* provided in the frame region F, and formed of the same material and in the same layer as the first TFTs 9*a*, the second TFTs 9*b* and the third TFTs 9*c* within the pixels to constitute the drive circuit M.

In the TFT layer 30*a*, the base coat film 11, semiconductor layers 12*a* and 12*b*, a gate insulating film 13, a first wire layer, an interlayer insulating film 15, a second wire layer, a protective film 20*a*, the first flattening film 21*a*, a third wire layer, and the second flattening film 23*a* are sequentially stacked on the resin substrate layer 10, as illustrated in FIG. 3. Here, the first wire layer is composed of components, including gate lines 14*d*, light-emission control lines 14*e*, and gate electrodes 14*a* and 14*b*, all of which will be described later on. Further, the second wire layer is composed of components, including source lines 16*f*, source electrodes 16*a* and 16*c*, and drain electrodes 16*b* and 16*d*, all of which will be described later on. Further, the third wire layer is composed of metal wire layers, including power source line 22*a* and a relay layer 22*b*, both of which will be described later on.

The TFT layer 30*a* includes, as illustrated in FIGS. 2 and 4, a plurality of gate lines 14*d* provided in the display region D so as to extend in parallel with each other in the lateral directions of the drawings. The TFT layer 30 also includes, as illustrated in FIGS. 2 and 4, a plurality of light-emission control lines 14*e* provided in the display region D so as to extend in parallel with each other in the lateral directions of the drawings. Here, the gate lines 14*d* and the light-emission control lines 14*e* are, in the frame region F, electrically connected to the drive circuit M (see FIG. 1) provided in a monolithic manner on the resin substrate layer 10. It is noted that the drive circuit M includes, but not limited to, a scan-signal control circuit electrically connected to the gate lines 14*d*, and a light-emission-signal control circuit electrically connected to the light-emission control lines 14*e*. It is also noted that the individual light-emission control lines 14*e* are provided to be adjacent to the individual gate lines 14*d*, as illustrated in FIG. 2. Further, the TFT layer 30*a* also includes, as illustrated in FIGS. 2 and 4, a plurality of source lines 16*f* provided in the display region D as display wires so as to extend in parallel with each other in the longitudinal directions of the drawings. It is noted that each source line 16f is, as illustrated in FIG. 1, provided in the frame region F so as to extend toward the terminal section T, and after change to another wire layer, each source wire 16f is electrically connected to a corresponding terminal C in the terminal section T. Further, in the TFT layer 30a, the power source line 22a is provided in lattice in the display region D, as illustrated in FIG. 1. Further, in the TFT layer 30a, each sub-pixel P includes a first TFT 9a, a second TFT 9b, a third TFT 9c, and a capacitor 9d, as illustrated in FIG. 4.

The base coat film 11 is composed of an inorganic insulating monolayer or laminated film of, for instance, silicon oxide.

The first TFT 9a in each sub-pixel P is electrically connected to a corresponding gate line 14d, a corresponding source line 16f and a corresponding second TFT 9b, as illustrated in FIG. 4. Further, the first TFT9a includes the following sequentially provided on the base coat film 11, as illustrated in FIG. 3: the semiconductor layer 12a; the gate insulating film 13; the gate electrode 14a; the interlayer insulating film 15; and the source electrode 16a and the drain electrode 16b. Here, the semiconductor layer 12a is provided in the form of an island on the base coat film 11, as illustrated in FIG. 3, and has a channel region, a source region, and a drain region, as described later on. The semiconductor layer 12a, as well as the semiconductor layer 12b and a semiconductor layer 12e of each extra-pixel TFT 9e, which will be described later on, are formed of an In-Ga-Zn-O oxide semiconductor for instance. It is noted that an In—Ga—Zn—O oxide semiconductor is a ternary oxide of indium (In), gallium (Ga), and zinc (Zn), and that the ratios (composition ratio) of In, Ga and Zn are not particularly limited. It is also noted that an In—Ga—Zn—O oxide semiconductor may be amorphous or crystalline. It is also noted that other oxide semiconductors, such as an In—Sn—Zn—O oxide semiconductor, may be used instead of an In—Ga—Zn—O oxide semiconductor. Further, the gate insulating film 13 is provided to cover the semiconductor layer 12a, as illustrated in FIG. 3. Further, the gate electrode 14a is provided on the gate insulating film 13 so as to overlap the channel region of the semiconductor layer 12a, as illustrated in FIG. 3. Further, the interlayer insulating film 15 is provided to cover the gate electrode 14a, as illustrated in FIG. 3. Further, the source electrode 16a and the drain electrode 16b are spaced from each other on the interlayer insulating film 15, as illustrated in FIG. 3. Further, the source electrode 16a and the drain electrode 16b are electrically connected respectively to the source region and drain region of the semiconductor layer 12a via respective contact holes formed in a stack of the gate insulating film 13 and the interlayer insulating film 15, as illustrated in FIG. 3. It is noted that the gate insulating film 13 and the interlayer insulating film 15 are composed of, for instance, an inorganic insulating monolayer or laminated film of, for instance, silicon oxide.

The second TFT 9b in each sub-pixel P is electrically connected to a corresponding first TFT 9a, a corresponding power source line 22a and a corresponding third TFT 9c, as illustrated in FIG. 4. It is noted that the second TFT9b has substantially the same structure as the first TFT 9a and the third TFT 9c, which will be described later on.

The third TFT 9c in each sub-pixel P is electrically connected to a corresponding second TFT 9b, a corresponding power source line 22a and a corresponding light-emission control line 14e, as illustrated in FIG. 4. Further, the third TFT 9c includes the following sequentially provided on the base coat film 11, as illustrated in FIG. 3: the semiconductor layer 12b; the gate insulating film 13; the gate electrode 14b; the interlayer insulating film 15; and the source electrode 16c and the drain electrode 16d. Here, the semiconductor layer 12b is provided in the form of an island on the base coat film 11, as illustrated in FIG. 3, and has a channel region, a source region, and a drain region, like the semiconductor layer 12a. Further, the gate insulating film 13 is provided to cover the semiconductor layer 12b, as illustrated in FIG. 3. Further, the gate electrode 14b is provided on the gate insulating film 13 so as to overlap the channel region of the semiconductor layer 12b, as illustrated in FIG. 3. Further, the interlayer insulating film 15 is provided to cover the gate electrode 14b, as illustrated in FIG. 3. Further, the source electrode 16c and the drain electrode 16d are spaced from each other on the interlayer insulating film 15, as illustrated in FIG. 3. Further, the source electrode 16c and the drain electrode 16d are electrically connected respectively to the source region and drain region of the semiconductor layer 12b via respective contact holes formed in a stack of the gate insulating film 13 and the interlayer insulating film 15, as illustrated in FIG. 3.

The extra-pixel TFTs 9e have substantially the same structure as the first TFTs 9a, the second TFTs 9b and the third TFTs 9c, as earlier described, and as illustrated in FIG. 6, the extra-pixels TFT 9e each include the following provided sequentially on the base coat film 11: the semiconductor layer 12e, the gate insulating film 13, and a gate electrode 14f.

It is noted that although the first TFTs 9a, the second TFTs 9b, the third TFTs 9c and the extra-pixel TFTs 9e fall under a top-gate type in this embodiment by way of example, the first TFTs 9a, the second TFTs 9b, the third TFTs 9c, and the extra-pixel TFTs 9e may be bottom-gate TFTs.

The capacitor 9d in each sub-pixel P is electrically connected to a corresponding first TFT 9a and a corresponding power source line 22a, as illustrated in FIG. 4. Here, the capacitor 9d includes the following: an upper conductive layer 14c formed in the same layer and of the same material as the gate electrode 14a and other things; a lower conductive layer (not shown) provided in the upper conductive layer 14c adjacent to the resin substrate layer 10; and inorganic insulating films (not shown), such as the gate insulating film 13, provided between the upper conductive layer 14c and the lower conductive layer. It is noted that the upper conductive layer 14c is electrically connected to the first TFT 9a, and that the lower conductive layer is electrically connected to the power source line 22a.

The protective film 20a includes a first protective film 17, a second protective film 18, and a third protective film 19 sequentially stacked on the second wire layer, including the source lines 16f Here, the first protective film 17 and the third protective film 19 are formed of an inorganic insulating film, such as a silicon oxide film having a thickness of about 50 to 200 nm. Further, the second protective film 18 is formed of an inorganic insulating film, such as a silicon nitride film having a thickness of about 200 to 600 nm. It is noted that the second protective film 18 may be formed of an inorganic insulating film, such as a silicon oxide nitride film, instead of a silicon nitride film.

The first flattening film 21a and the second flattening film 23a, as well as an edge cover 32a, which will be described later on, are composed of a photosensitive or non-photosensitive layer of resin, such as polyimide resin or acrylic resin. Here, the first trench Ga and the second trench Gb, provided in the form of a frame in the first flattening film 21a and the second flattening film 23a, intersect with each source line 16f to thus overlap the source line 16f in the frame region F.

It is noted that the first trench Ga and the second trench Gb, although provided in the form of a frame so as to surround the display region D by way of example in this embodiment, may be provided linearly or in a dot-like manner. Further, the width, Hb, of the second trench Gb (see FIG. 8, about 10 to 30 μm for instance) is larger than the width, Ha, of the first trench Ga (see FIG. 8, about 5 to 20 μm for instance), as illustrated in FIG. 6 to FIG. 8.

The power source line 22*a* is provided in lattice on the first flattening film 21*a*, as illustrated in FIG. 1 and FIG. 3.

The relay layer 22*b* is, in each sub-pixel P, provided in the form of an island on the first flattening film 21*a*, as illustrated in FIG. 3.

The organic EL element layer 35 is composed of a plurality of organic EL elements arranged in matrix and includes, as illustrated in FIG. 3, a plurality of first electrodes 31*a*, the edge cover 32*a*, a plurality of organic EL layers 33, and a second electrode 34 sequentially provided on the TFT layer 30*a*.

The plurality of first electrodes 31*a* are provided in matrix on the second flattening film 23*a* so as to correspond to the plurality of sub-pixels P, as illustrated in FIG. 3. Here, the first electrode 31*a* in each sub-pixel P is electrically connected to the drain electrode 16*d* of a corresponding third TFT 9*c* via a contact hole formed in the protective film 20*a* and first flattening film 21*a*, via the relay layer 22*b*, and via a contact hole formed in the second flattening film 23*a*, as illustrated in FIG. 3. Further, the first electrodes 31*a* have the function of injecting holes (positive holes) into the organic EL layers 33. Further, the first electrodes 31*a* are more desirably formed of a material having a large work function, in order to improve the efficiency of hole injection into the organic EL layers 33. Here, the first electrodes 31*a* are made of a metal material, including silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Further, the first electrodes 31*a* may be made of an alloy of, for instance, astatine (At) and astatine oxide (AtO$_2$). Furthermore, the first electrodes 31*a* may be made of a conductive oxide, such as tin oxide (SnO), zinc oxide (ZnO), an indium tin oxide (ITO), or an indium zinc oxide (IZO). Further, the first electrodes 31*a* may be formed of a stack of multiple layers made of the above materials. It is noted that examples of a compound material having a large work function include an indium tin oxide (ITO) and an indium zinc oxide (IZO).

The edge cover 32*a* is provided in lattice over the individual perimeters of the first electrodes 31*a* so as to be common to the plurality of sub-pixels P, as illustrated in FIG. 3.

The plurality of organic EL layers 33 are disposed on the respective first electrodes 31*a* and are provided in matrix so as to correspond to the plurality of sub-pixels P, as illustrated in FIG. 3. Here, each organic EL layer 33 includes the following sequentially disposed on the first electrode 31*a*, as illustrated in FIG. 5: a hole injection layer 1, a hole transport layer 2, a light-emitting layer 3, an electron transport layer 4, and an electron injection layer 5.

The hole injection layer 1 is also called an anode buffer layer and has the function of bringing the energy levels of the first electrode 31*a* and organic EL layer 33 close to each other to improve the efficiency of hole injection from the first electrode 31*a* to the organic EL layer 33. Here, examples of the material of the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 has the function of improving the efficiency of hole transport from the first electrode 31*a* to the organic EL layer 33. Here, examples of the material of the hole transport layer 2 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 3 is a region where holes and electrons are respectively injected from the first electrode 31*a* and second electrode 34 applied with voltage, and where the holes and electrons rejoin. Here, the light-emitting layer 3 is made of a material having high efficiency of light emission. Moreover, examples of the material of the light-emitting layer 3 include a metal oxinoid compound [8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bisstyrylbenzene derivative, a trisstyrilbenzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, and polysilane.

The electron transport layer 4 has the function of moving electrons to the light-emitting layer 3 efficiently. Here, the electron transport layer 4 is composed of an organic compound, including an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 has the function of bringing the energy levels of the second electrode 34 and organic EL layer 33 close to each other to improve the efficiency of electron injection from the second electrode 34 into the organic EL layer 33; this function can lower voltage for driving each organic EL element constituting the organic EL element layer 35. It is noted that the electron injection layer 5 is also called a cathode buffer layer. Here, examples of the material of the electron injection layer 5 include an inorganic alkali compound such as lithium fluoride (LiF), magnesium fluoride (MgF$_2$), calcium fluoride (CaF$_2$), strontium fluoride (SrF$_2$), and barium fluoride (BaF$_2$), as well as an aluminum oxide (Al$_2$O$_3$) and strontium oxide (SrO).

The second electrode 34 is provided over the individual organic EL layers 33 and the edge cover 32*a* so as to be common to the plurality of sub-pixels P, as illustrated in FIG. 3. Further, the second electrode 34 is provided to cover the first trench Ga and the second trench Gb in the frame region F, as illustrated in FIG. 8. Further, the second electrode 34 has the function of injecting electrons into the organic EL layers 33. Further, the second electrode 34 is more desirably made of a material having a small work function, in order to improve the efficiency of electron injection into the organic EL layers 33. Here, examples of the material of the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Further, the second electrode 34 may be made of, for instance, alloy of magnesium (Mg) and copper (Cu), alloy of magnesium (Mg) and silver (Ag), alloy of sodium (Na) and potassium (K), alloy of astatine (At) and astatine oxide ($AtO_2$), alloy of lithium (Li) and aluminum (Al), alloy of lithium (Li), calcium (Ca) and aluminum (Al), or alloy of lithium fluoride (LiF), calcium (Ca) and aluminum (Al). Further, the second electrode 34 may be formed of a conductive oxide, such as tin oxide (SnO), zinc oxide (ZnO), an indium tin oxide (ITO), or an indium zinc oxide (IZO). Further, the second electrode 34 may be formed of a stack of multiple layers made of the above materials. It is noted that examples of a material having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

The sealing film 40 is provided to cover the second electrode 34 and includes a first inorganic sealing film 36, an organic sealing film 37, and a second inorganic sealing film 38 sequentially stacked on the second electrode 34, as illustrated in FIG. 3, and the sealing film 40 has the function of protecting the individual organic EL layers 33 in the organic EL element layer 35 from moisture and oxygen. Here, the first inorganic sealing film 36 and the second inorganic sealing film 38 are composed of an inorganic insulating film, such as a silicon nitride film, a silicon oxide film, or a silicon oxide nitride film. Further, the organic sealing film 37 is made of an organic resin material, such as acrylic resin, epoxy resin, silicone resin, polyurea resin, parylene resin, polyimide resin, or polyamide resin.

The organic EL display 50a also includes, in the frame region F, a barrier wall W provided in the form of a frame outside the trench G, as illustrated in FIG. 1. Here, the barrier wall W includes, as illustrated in FIG. 7, a first barrier wall Wa provided inside (left side in the drawing) in the form of a frame, and a second barrier wall Wb provided outside (right side in the drawing) in the form of a frame.

The first barrier wall Wa includes a resin layer 32c formed of the same material and in the same layer as the edge cover 32a, as illustrated in FIG. 7. It is noted that the first barrier wall Wa is provided to overlap the perimeter of the organic sealing film 37 of the sealing film 40 and is configured to prevent the spread of ink constituting the organic sealing film 37.

The second barrier wall Wb includes the following, as illustrated in FIG. 7: a lower resin layer 21b formed of the same material and in the same layer as the first flattening film 21a; a middle resin layer 23b formed of the same material and in the same layer as the second flattening film 23a; and an upper resin layer 32d formed of the same material and in the same layer as the edge cover 32a.

The organic EL display 50a also includes, as illustrated in FIG. 1, a first frame wire 16h provided in the form of a frame as the second wire layer inside the first trench Ga and the second trench Gb in the frame region F, and having a side near the terminal section T extending to the terminal section T at two locations. Here, the first frame wire 16h is electrically connected to the power source line 22a in the frame region F adjacent to the display region D and is configured to receive high power source voltage (ELVDD) in the terminal section T.

The organic EL display 50a also includes, as illustrated in FIG. 1, a second frame wire 16i provided in the form of a substantial C-shape as the second wire layer outside the first trench Ga and the second trench Gb in the frame region F, and having both ends extending to the terminal section T. Here, the second frame wire 16i is electrically connected to the second electrode 34 via a conductive layer 31b formed in the first trench Ga and second trench Gb, as illustrated in FIG. 7, and is configured to receive low power source voltage (ELVSS) in the terminal section T. It is noted that the conductive layer 31b is made of the same material and provided in the same layer as the first electrodes 31a.

In each sub-pixel P of the organic EL display 50a, a gate signal is input to the first TFT 9a via the gate line 14d to turn on the first TFT 9a, a predetermined voltage corresponding to a source signal is written into the gate electrode 14b of the second TFT 9b and the capacitor 9d via the source line 16f, thus inputting a light-emission control signal to the third TFT 9c via the light-emission control line 14e to turn on the third TFT 9c, and a current corresponding to a gate voltage of the second TFT 9b is supplied from the power source line 22a to the organic EL layer 33, thus causing the light-emitting layer 3 of the organic EL layer 33 to emit light for image display. It is noted that in the organic EL display 50a, the gate voltage of the second TFT 9b is maintained by the capacitor 9d even when the first TFT 9a is turned off, and that the light-emitting layer 3 thus keeps on emitting light in each sub-pixel P until a gate signal in the next frame is input.

Next, a method for manufacturing the organic EL display 50a according to this embodiment will be described. It is noted that the method for manufacturing the organic EL display 50a according to this embodiment includes a TFT layer forming step, an organic-EL element layer forming step, and a sealing film forming step.

TFT Layer Forming Step

The first process step is forming the base coat film 11 by, for instance, forming an inorganic insulating film (about 1000 nm thick), such as a silicon oxide film, onto the resin substrate layer 10 formed on a glass substrate through plasma chemical vapor deposition (CVD) for instance.

The next is forming, through sputtering, an oxide semiconductor film (about 10 to 100 nm thick) of $InGaZnO_4$ or other materials for instance, onto the entire substrate with the base coat film 11 formed thereon, followed by subjecting the oxide semiconductor film to photolithography, etching and resist removal to thus form the semiconductor layer 12a and other components.

The next is forming, through plasma CVD, an inorganic insulating film (about 80 to 300 nm thick), such as a silicon oxide film, onto the entire substrate with the semiconductor layer 12a and other components formed thereon, to thus form the gate insulating film 13.

Furthermore, the entire substrate with the gate insulating film 13 formed thereon undergoes, for instance, sputtering to sequentially form an aluminum film (about 350 nm thick), a molybdenum nitride film (about 50 nm thick) and other components, and this metal stacked film then undergoes patterning to form the first wire layer, including the gate electrode 14a. It is noted that the metal stacked film may be composed of a titanium film (about 10 to 100 nm thick) and an aluminum film (about 100 to 500 nm thick), other than the foregoing aluminum film and molybdenum nitride film. Thereafter, the gate insulating film 13 undergoes patterning through dry etching by using the first wire layer as a mask and by forming a photo resist pattern separately through photolithography.

The next is forming channel regions, source regions, and drain regions in the semiconductor layer 12a and other components through, but not limited to, a hydrogen plasma process or a helium plasma process using the first wire layer as a mask.

The next is forming, through plasma CVD for instance, an inorganic insulating film (about 100 to 500 nm thick), such as a silicon oxide film, onto the entire substrate with the channel regions, source regions and drain regions formed in the semiconductor layer 12a and other components, to thus form the interlayer insulating film 15. It is noted that the inorganic insulating film may be a stack of a silicon oxide film and a silicon nitride film, other than the foregoing silicon oxide film.

Furthermore, the entire substrate with the interlayer insulating film 15 formed thereon undergoes, for instance, sputtering to sequentially form a titanium film (about 10 to 100 nm thick), an aluminum film (about 100 to 500 nm thick), a titanium film (about 10 to 100 nm thick), and other components, and this metal stacked film then undergoes patterning to form the second wire layer, including the source electrode 16a.

The next is successively forming a silicon oxide film (about 50 to 200 nm thick), a silicon nitride film (about 100 500 nm thick), and a silicon oxide film (about 50 to 200 nm thick) onto the entire surface with the second wire layer formed thereon, through plasma CVD for instance, followed by patterning this inorganic insulating stacked film to form the protective film 20a.

The next is applying a photosensitive resin layer of polyimide (about 2 μm thick) onto the entire surface with the protective film 20a formed thereon, through spin coating or slit coating for instance, followed by subjecting this applied film to pre-baking, exposure, development and post-baking to form the first flattening film 21a.

Furthermore, the entire substrate with the first flattening film 21a formed thereon undergoes, for instance, sputtering to sequentially form a titanium film (about 10 to 100 nm thick), an aluminum film (about 100 to 500 nm thick), a titanium film (about 10 to 100 nm thick), and other components, and this metal stacked film then undergoes patterning to form the third wire layer, including the power source line 22a.

The final process step is applying a photosensitive resin layer of polyimide (about 2 μm thick) onto the entire surface with the third wire layer formed thereon, through spin coating or slit coating for instance, followed by subjecting this applied film to pre-baking, exposure, development and post-baking to form the second flattening film 23a.

The TFT layer 30a can be formed through the foregoing process steps.

Organic-EL Element Layer Forming Step

The organic EL element layer 35 is formed by forming, with a well-known method, the first electrodes 31a, the edge cover 32a, the organic EL layers 33 (the hole injection layers 1, the hole transport layers 2, the light-emitting layers 3, the electron transport layers 4, and the electron injection layers 5), and the second electrode 34 onto the second flattening film 23a of the TFT layer 30a formed in the TFT layer forming step.

Sealing Film Forming Step

Firstly, the first inorganic sealing film 36 is formed by forming, through plasma CVD using a mask, an inorganic insulating film, such as a silicon nitride film, a silicon oxide film, or a silicon oxide nitride film, onto the substrate surface provided with the organic EL element layer 35 formed in the organic-EL element layer forming step.

Then, the organic sealing film 37 is formed by forming, through an ink-jet method for instance, a film of an organic resin material, such as acrylic resin, onto the substrate surface with the first inorganic sealing film 36 formed thereon.

Thereafter, through plasma CVD using a mask, an inorganic insulating film, such as a silicon nitride film, a silicon oxide film, or a silicon oxide nitride film, is formed onto the substrate with the organic sealing film 37 formed thereon, to form the second inorganic sealing film 38, thus forming the sealing film 40.

The final process step is attaching a protective sheet (not shown) onto the substrate surface with the sealing film 40 formed thereon, followed by laser light irradiation from near the glass substrate of the resin substrate layer 10 to detach the glass substrate from the lower surface of the resin substrate layer 10, followed by further attaching a protective sheet (not shown) to the lower surface of the resin substrate layer 10 with the glass substrate detached therefrom.

The organic EL display 50a according to this embodiment can be manufactured through the foregoing process steps.

As described above, the organic EL display 50a according to this embodiment is configured such that the TFT layer 30a includes a stack of, in sequence, the second wire layer including the plurality of source lines 16f, the protective film 20a, the first flattening film 21a, the third wire layer including the power source line 22a, and the second flattening film 23a. Here, the plurality of source lines 16f are provided to extend in parallel with each other in the display region D and to extend toward the terminal section T disposed at the end of the frame region F. Moreover, in the frame region F, the first trench Ga, which intersects with each source line 16f and passes through the first flattening film 21a, is provided in the form of a frame in the first flattening film 21a, and the second trench Gb, which intersects with each source line 16f and passes through the second flattening film 23a, is provided in the form of a frame in the second flattening film 23a. Furthermore, the second electrode 34, constituting the organic EL element layer 35, is provided to cover the first trench Ga and the second trench Gb. Herein, the protective film 20a on the individual source lines 16f includes a stack of, in sequence, the first protective film 17 formed of a silicon oxide film, the second protective film 18 formed of a silicon nitride film, and the third protective film 19 formed of a silicon oxide film. Hence, the third protective film 19 formed of a silicon oxide film is disposed under the third wire layer, including the power source line 22a; thus, loss of the protective film 20a resulting from etching can be prevented even when, in the TFT layer forming step, wet etching using hydrogen fluoride is performed for forming the third wire layer, including the power source line 22a, after the first flattening film 21a having the first trench Ga is formed. Accordingly, the second electrode 34, even when formed in the organic-EL element layer forming step, is electrically insulated from each source line 16f by the protective film 20a, thereby preventing a short circuit between each source line 16f and the second electrode 34 in portions where the source line 16f intersects with the first trench Ga and the second trench Gb.

Further, the organic EL display 50a according to this embodiment is configured such that the second protective film 18, constituting the protective film 20a, is formed of a silicon nitride film, thereby enabling the second protective film 18 to regulate a stress that is applied to the entire display, thus preventing warping in the organic EL display 50a.

Further, the organic EL display 50a according to this embodiment is configured such that in the frame region F, the first trench Ga, passing through the first flattening film 21a, is provided in the form of a frame in the first flattening film 21a so as to surround the display region D, and such that in the frame region F, the second trench Gb, passing through the second flattening film 23a, is provided in the form of a frame in the second flattening film 23a so as to surround the display region D. This configuration can prevent moisture within the first flattening film 21a and second flattening film 23a from ingress from the frame region F into the display region D, thereby preventing degradation of the organic EL layers 33 and improving the reliability of the organic EL display 50a.

Further, the organic EL display 50a according to this embodiment is configured such that the barrier wall W (the first barrier wall Wa and the second barrier wall Wb) is provided in the form of a frame on the outside of the first trench Ga and second trench Gb in a plan view so as to overlap the perimeter of the organic sealing film 37, constituting the sealing film 40. Here, on the outside of the second barrier wall Wb, constituting the barrier wall W, in a plan view, the first inorganic sealing film 36, constituting the sealing film 40, is in contact with the protective film 20a of the TFT layer 30a and with the interlayer insulating film 15, thereby enhancing the sealing performance of the sealing film 40, thus preventing degradation of the organic EL layers 33 and improving the reliability of the organic EL display 50a.

Second Embodiment

Figure 9:
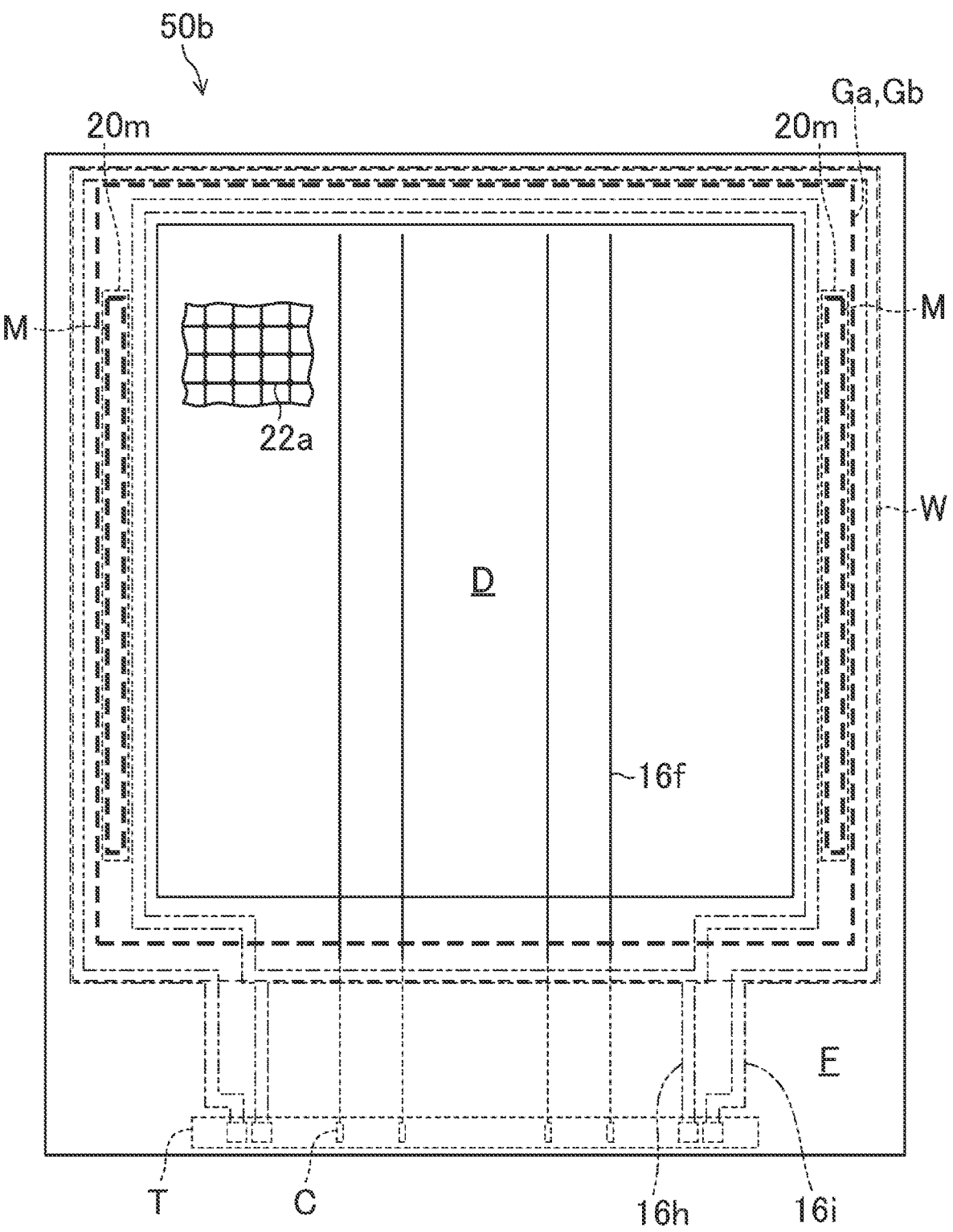
FIG. 9 is a plan view of a schematic configuration of an organic EL display according to a second embodiment of the present disclosure.
Figure 10:
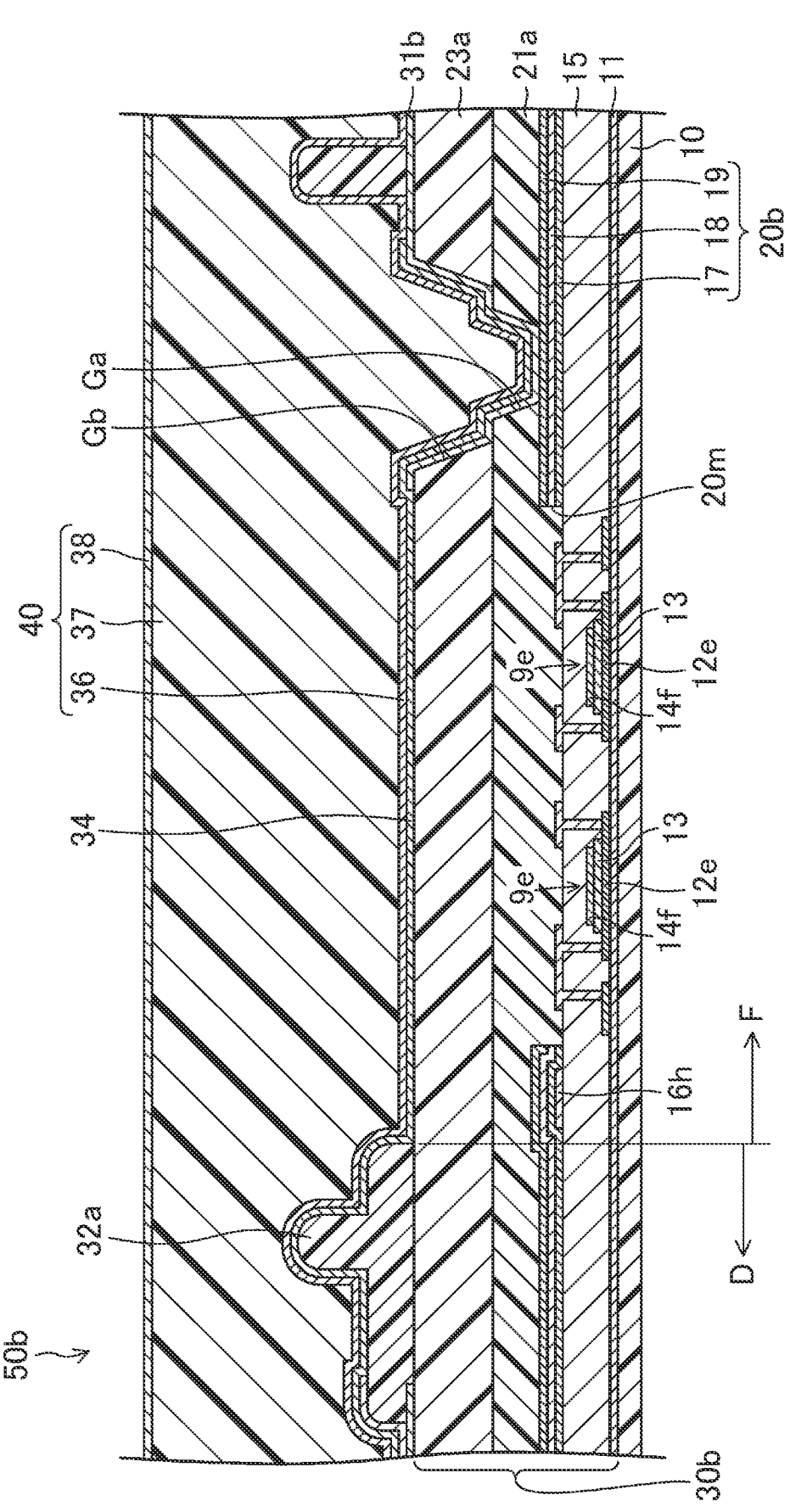
FIG. 10 is a sectional view of the organic EL display according to the second embodiment of the present disclosure and corresponds to FIG. 6.
Figure 11:
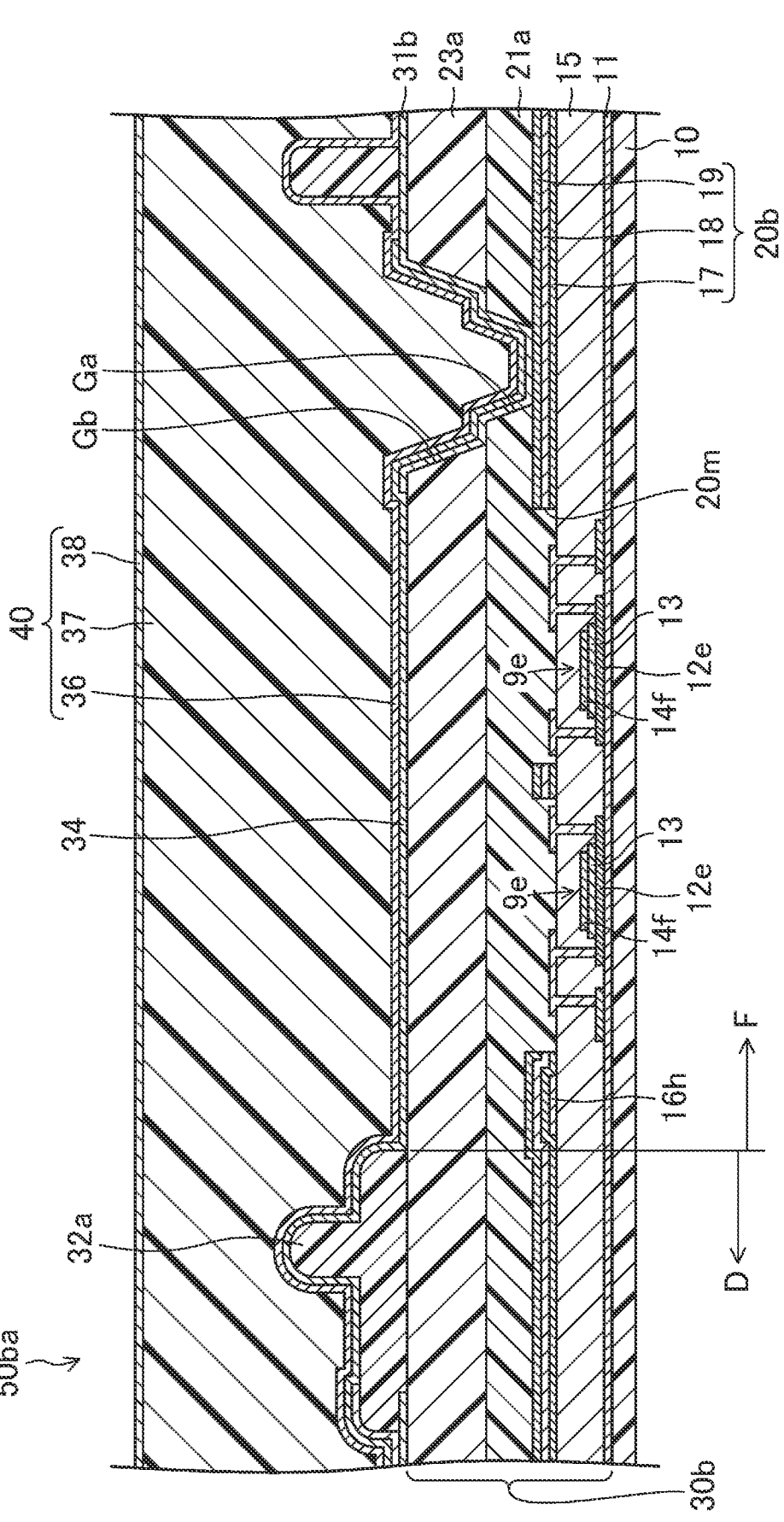
FIG. 11 is a sectional view of a modification the organic EL display according to the second embodiment of the present disclosure and corresponds to FIG. 10.

FIG. 9 to FIG. 11 illustrate a second embodiment of the display device according to the present disclosure. Here, FIG. 9 is a plan view of a schematic configuration of an organic EL display 50b according to this embodiment. Further, FIG. 10 is a sectional view of the organic EL display 50b and corresponds to FIG. 6, which has been described in the first embodiment. Further, FIG. 11 is a sectional view of an organic EL display 50ba, which is a modification of the organic EL display 50b, and corresponds to FIG. 10. It is noted that in the following embodiment, the same components as those in FIG. 1 to FIG. 8 will be denoted by the same signs, and their detailed description will be omitted.

The first embodiment has described, by way of example, the organic EL display 50a with the protective film 20a provided also on the drive circuit M, whereas this embodiment describes, by way of example, the organic EL display 50b with a protective film 20b not provided on a drive circuit M.

The organic EL display 50b has, like the organic EL display 50a according to the first embodiment, a display region D provided in the form of a rectangular shape and provided for image display, and a frame region F provided in the form of a rectangular frame around the display region D.

The organic EL display 50b includes the following, as illustrated in FIG. 10: a resin substrate layer 10; a TFT layer 30b provided on the resin substrate layer 10; an organic EL element layer 35 provided on the TFT layer 30b; and a sealing film 40 provided on the organic EL element layer 35.

The TFT layer 30b substantially has the same configuration as the TFT layer 30a according to the first embodiment with only the exception that the protective film 20b is provided instead of the protective film 20a in the TFT layer 30a according to the first embodiment.

The protective film 20b includes, as illustrated in FIG. 10, a first protective film 17, a second protective film 18, and a third protective film 19 sequentially stacked on a second wire layer, including source lines 16f Here, the protective film 20b has an opening 20m exposing the drive circuit M from the protective film 20b, as illustrated in FIG. 9 and FIG. 10. Moreover, the edge of the opening 20m of the protective film 20b is provided to surround the entire drive circuit M in a plan view, as illustrated in FIG. 9. It is noted that the edge of the opening 20m of the protective film 20b may be provided to surround individual extra-pixels TFT 9e, like that in the organic EL display 50ba according to the modification illustrated in FIG. 11.

The organic EL display 50b has flexibility, like the organic EL display 50a according to the first embodiment, and is configured to perform image display by causing a light-emitting layer 3 of an organic EL layer 33 to emit light in each sub-pixel P, as appropriate, via a first TFT 9a, a second TFT 9b and a third TFT 9c.

The organic EL display 50b according to this embodiment can be manufactured by changing the pattern shape for forming the protective film 20a in the method for manufacturing the organic EL display 50a according to the first embodiment.

As described above, the organic EL display 50b according to this embodiment is configured such that the TFT layer 30b includes a stack of, in sequence, the second wire layer including the plurality of source lines 16f, the protective film 20b, a first flattening film 21a, a third wire layer including a power source line 22a, and a second flattening film 23a. Here, the plurality of source lines 16f are provided to extend in parallel with each other in the display region D and to extend toward the terminal section T disposed at the end of the frame region F. Moreover, in the frame region F, a first trench Ga, which intersects with each source line 16f and passes through the first flattening film 21a, is provided in the form of a frame in the first flattening film 21a, and a second trench Gb, which intersects with each source line 16f and passes through the second flattening film 23a, is provided in the form of a frame in the second flattening film 23a. Furthermore, a second electrode 34 constituting the organic EL element layer 35 is provided to cover the first trench Ga and the second trench Gb. Herein, the protective film 20b on each source line 16f includes a stack of, in sequence, the first protective film 17 formed of a silicon oxide film, the second protective film 18 formed of a silicon nitride film, and the third protective film 19 formed of a silicon oxide film. Hence, the third protective film 19 formed of a silicon oxide film is disposed under the third wire layer, including the power source line 22a; thus, loss of the protective film 20b resulting from etching can be prevented even when, in the TFT layer forming step, wet etching using hydrogen fluoride is performed for forming the third wire layer, including the power source line 22a, after the first flattening film 21a having the first trench Ga is formed. Accordingly, the second electrode 34, even when formed in the organic-EL element layer forming step, is electrically insulated from each source line 16*f* by the protective film 20*b,* thereby preventing a short circuit between each source line 16*f* and the second electrode 34 in portions where the source line 16*f* intersects with the first trench Ga and the second trench Gb.

Further, the organic EL display 50*b* according to this embodiment is configured such that the second protective film 18, constituting the protective film 20*b,* is formed of a silicon nitride film, thereby enabling the second protective film 18 to regulate a stress that is applied to the entire display, thus preventing warping in the organic EL display 50*b.*

Further, the organic EL display 50*b* according to this embodiment is configured such that in the frame region F, the first trench Ga, passing through the first flattening film 21*a,* is provided in the form of a frame in the first flattening film 21*a* so as to surround the display region D, and such that in the frame region F, the second trench Gb, passing through the second flattening film 23*a,* is provided in the form of a frame in the second flattening film 23*a* so as to surround the display region D. This configuration can prevent moisture within the first flattening film 21*a* and second flattening film 23*a* from ingress from the frame region F into the display region D, thereby preventing degradation of the organic EL layers 33 and improving the reliability of the organic EL display 50*b.*

Further, the organic EL display 50*b* according to this embodiment is configured such that a barrier wall W (a first barrier wall Wa and a second barrier wall Wb) is provided in the form of a frame on the outside of the first trench Ga and second trench Gb in a plan view so as to overlap the perimeter of an organic sealing film 37 constituting the sealing film 40. Here, on the outside of the second barrier wall Wb, constituting the barrier wall W, in a plan view, a first inorganic sealing film 36 constituting the sealing film 40 is in contact with the protective film 20*b* of the TFT layer 30*b* and with an interlayer insulating film 15, thereby enhancing the sealing performance of the sealing film 40, thus preventing degradation of the organic EL layers 33 and improving the reliability of the organic EL display 50*b.*

Further, the organic EL display 50*b* according to this embodiment is configured such that the protective film 20*b* has an opening 20*m* exposing the drive circuit M from the protective film 20*b;* hence, the second protective film 18 composed of a silicon nitride film is not disposed close to the upper layer of the semiconductor layer 12*e* in the extra-pixel TFT 9*e* constituting the drive circuit M. Consequently, the semiconductor layer 12*e* composed of an In—Ga—Zn—O oxide semiconductor is less affected by hydrogen diffusion from the second protective film 18 heated during a manufacturing process step, and thus, reduction in the threshold of the extra-pixel TFT 9*e* including the semiconductor layer 12*e* can be prevented.

Other Embodiments

Although the foregoing embodiments have described, by way of example, an organic EL layer having a five-ply stacked structure of a hole injection layer, a hole transport layer, a light-emitting layer, an electron transport layer, and an electron injection layer, the organic EL layer may have a three-ply structure of, for instance, a hole injection and transport layer, a light-emitting layer, and an electron transport and injection layer.

Further, although the foregoing embodiments have described, by way of example, an organic EL display having a first electrode that is an anode, and a second electrode that is a cathode, the present disclosure is also applicable to an organic EL display with the stacked structure of its organic EL layer being inverted: a first electrode as a cathode, and a second electrode as an anode.

Further, although the foregoing embodiments have described, by way of example, an organic EL display having a drain electrode that is a TFT electrode connected to a first electrode, the present disclosure is also applicable to an organic EL display having a source electrode that is a TFT electrode connected to a first electrode.

Further, although the foregoing embodiments have described an organic EL display as a display device by way of example, the present disclosure is applicable to a display device including a plurality of light-emitting elements that are driven by current. For instance, the present disclosure is applicable to a display device including quantum-dot light-emitting diodes (QLEDs), which are light-emitting elements included in a layer containing quantum dots.

INDUSTRIAL APPLICABILITY

As described above, the present disclosure is useful for flexible display devices.

The invention claimed is:

1. A display device comprising:
   a base substrate;
   a thin-film transistor layer provided on the base substrate and including a stack of, in sequence, a plurality of display wires, a protective film, a first flattening film, a metal wire layer, and a second flattening film; and
   a light-emitting element layer provided on the thin-film transistor layer and including a plurality of first electrodes, a plurality of light-emitting layers, and a common second electrode stacked sequentially in correspondence with a plurality of sub-pixels forming a display region,
   wherein the plurality of display wires is provided to extend in parallel with each other in the display region, and to extend toward a terminal section disposed in a frame region around the display region,
   in the frame region, a first trench overlapping each of the plurality of display wires and passing through the first flattening film is provided in the first flattening film, and a second trench overlapping each of the plurality of display wires and passing through the second flattening film is provided in the second flattening film,
   the common second electrode is provided to cover the first trench and the second trench,
   the protective film includes a first protective film, a second protective film, and a third protective film sequentially stacked on the plurality of display wires,
   the first protective film and the third protective film are formed of a silicon oxide film, and
   the second protective film is formed of a silicon nitride film,
   a drive circuit including a plurality of extra-pixel thin-film transistors is provided between the first trench and the display region and between the second trench and the display region,
   the protective film has an opening exposing the drive circuit from the protective film, and
   in a plan view, an edge of the opening is provided to entirely surround the drive circuit.

2. The display device according to claim 1, wherein the first trench and the second trench are provided linearly to intersect with each of the plurality of display wires.

3. The display device according to claim 2, wherein the first trench and the second trench are provided in a frame shape to surround the display region.

4. The display device according to claim 2, wherein a width of the second trench is larger than a width of the first trench.

5. A display device comprising:

a base substrate;

a thin-film transistor layer provided on the base substrate and including a stack of, in sequence, a plurality of display wires, a protective film, a first flattening film, a metal wire layer, and a second flattening film; and a light-emitting element layer provided on the thin-film transistor layer and including a plurality of first electrodes, a plurality of light-emitting layers, and a common second electrode stacked sequentially in correspondence with a plurality of sub-pixels forming a display region, wherein the plurality of display wires is provided to extend in parallel with each other in the display region, and to extend toward a terminal section disposed in a frame region around the display region, in the frame region, a first trench overlapping each of the plurality of display wires and passing through the first flattening film is provided in the first flattening film, and a second trench overlapping each of the plurality of display wires and passing through the second flattening film is provided in the second flattening film, the common second electrode is provided to cover the first trench and the second trench, the protective film includes a first protective film, a second protective film, and a third protective film sequentially stacked on the plurality of display wires, the first protective film and the third protective film are formed of a silicon oxide film, the second protective film is formed of a silicon nitride film, a drive circuit including a plurality of extra-pixel thin-film transistors is provided between the first trench and the display region and between the second trench and the display region, the protective film has an opening exposing the drive circuit from the protective film, and in a plan view, an edge of the opening is provided to surround each of the plurality of extra-pixel thin-film transistors.

6. The display device according to claim 1, wherein each of the plurality of extra-pixel thin-film transistors includes a semiconductor layer composed of an In—Ga—Zn—O oxide semiconductor.

7. The display device according to claim 1, wherein the first flattening film and the second flattening film are formed of a resin layer.

8. The display device according to claim 1, wherein the thin-film transistor layer further includes a plurality of intra-pixel thin-film transistors provided in the display region, and each of the plurality of display wires is electrically connected to a corresponding one of the plurality of intra-pixel thin-film transistors, and is, in the terminal section with a plurality of terminals arranged, electrically connected to a corresponding one of the plurality of terminals.

9. The display device according to claim 8, wherein each of the plurality of first electrodes is electrically connected to a corresponding one of the plurality of intra-pixel thin-film transistors via a relay layer provided as the metal wire layer.

10. The display device according to claim 8, wherein each of the plurality of intra-pixel thin-film transistors includes a semiconductor layer composed of an In—Ga—Zn—O oxide semiconductor.

11. The display device according to claim 1, wherein the display region is provided in a rectangular shape, a first frame wire to which a relatively high power source voltage is input is provided on an inside of the first trench and the second trench in a plan view, a second frame wire to which a relatively low power source voltage is input is provided on an outside of the first trench and the second trench in a plan view, and in the first trench and the second trench not extending along the terminal section, the common second electrode and the second frame wire are electrically connected together via a conductive layer formed of a same material and in a same layer as each of the plurality of first electrodes.

12. The display device according to claim 5, wherein the first trench and the second trench are provided linearly to intersect with each of the plurality of display wires.

13. The display device according to claim 12, wherein the first trench and the second trench are provided in a frame shape to surround the display region.

14. The display device according to claim 12, wherein a width of the second trench is larger than a width of the first trench.

15. The display device according to claim 5, wherein each of the plurality of extra-pixel thin-film transistors includes a semiconductor layer composed of an In—Ga—Zn—O oxide semiconductor.

16. The display device according to claim 5, wherein the first flattening film and the second flattening film are formed of a resin layer.

17. The display device according to claim 5, wherein the thin-film transistor layer further includes a plurality of intra-pixel thin-film transistors provided in the display region, and each of the plurality of display wires is electrically connected to a corresponding one of the plurality of intra-pixel thin-film transistors, and is, in the terminal section with a plurality of terminals arranged, electrically connected to a corresponding one of the plurality of terminals.

18. The display device according to claim 17, wherein each of the plurality of first electrodes is electrically connected to a corresponding one of the plurality of intra-pixel thin-film transistors via a relay layer provided as the metal wire layer.

19. The display device according to claim 17, wherein each of the plurality of intra-pixel thin-film transistors includes a semiconductor layer composed of an In—Ga—Zn—O oxide semiconductor.

20. The display device according to claim 5, wherein the display region is provided in a rectangular shape, a first frame wire to which a relatively high power source voltage is input is provided on an inside of the first trench and the second trench in a plan view, a second frame wire to which a relatively low power source voltage is input is provided on an outside of the first trench and the second trench in a plan view, and in the first trench and the second trench not extending along the terminal section, the common second electrode and the second frame wire are electrically connected together via a conductive layer formed of a same material and in a same layer as each of the plurality of first electrodes.

\* \* \* \* \*